(12) United States Patent
Struempfel et al.

(10) Patent No.: US 6,361,668 B1
(45) Date of Patent: Mar. 26, 2002

(54) SPUTTERING INSTALLATION WITH TWO LONGITUDINALLY PLACED MAGNETRONS

(75) Inventors: Johannes Struempfel; Guenter Beister; Wolfgang Erbkamm; Stanley Rehn, all of Dresden (DE)

(73) Assignee: Von Ardenne Anlagentechnik GmbH, Dresden (DE)

(*) Notice: Subject to any disclaimer, the term of this patent is extended or adjusted under 35 U.S.C. 154(b) by 0 days.

(21) Appl. No.: 09/171,228
(22) PCT Filed: Apr. 29, 1997
(86) PCT No.: PCT/DE97/00876
§ 371 Date: Mar. 26, 1999
§ 102(e) Date: Mar. 26, 1999
(87) PCT Pub. No.: WO97/41587
PCT Pub. Date: Nov. 6, 1997

(30) Foreign Application Priority Data

Apr. 29, 1996 (DE) .......................... 196 17 057

(51) Int. Cl.$^7$ ............................................. C23C 14/34
(52) U.S. Cl. ............................. 204/298.19; 204/298.26; 204/192.12
(58) Field of Search ....................... 204/192.12, 298.18, 204/298.19, 298.26

(56) References Cited

U.S. PATENT DOCUMENTS

| | | | | |
|---|---|---|---|---|
| 4,411,763 A | * | 10/1983 | Itaba et al. | 204/298.19 |
| 4,865,708 A | * | 9/1989 | Welty | 204/192.12 |
| 4,956,070 A | * | 9/1990 | Nakada et al. | 204/298.18 |
| 4,964,968 A | * | 10/1990 | Arita | 204/298.19 |
| 5,169,509 A | * | 12/1992 | Latz et al. | 204/298.03 |
| 5,317,006 A | * | 5/1994 | Kumar | 204/298.12 |
| 5,338,422 A | * | 8/1994 | Belkind et al. | 204/192.12 |
| 5,382,344 A | * | 1/1995 | Hosokawa et al. | 204/298.2 |
| 5,415,754 A | * | 5/1995 | Manley | 204/192.12 |
| 5,415,757 A | * | 5/1995 | Szcyrbowski et al. | 204/298.08 |
| 5,458,759 A | * | 10/1995 | Hosokawa et al. | 204/298.2 |
| 5,693,199 A | * | 12/1997 | Bourez et al. | 204/192.12 |

FOREIGN PATENT DOCUMENTS

| | | |
|---|---|---|
| DE | 4100291 | 10/1991 |
| DE | 4022461 | 1/1992 |
| EP | 0502242 | 9/1992 |

* cited by examiner

*Primary Examiner*—Stephen Kalafut
*Assistant Examiner*—Julian A. Mercado
(74) *Attorney, Agent, or Firm*—Jordan and Hamburg LLP

(57) ABSTRACT

A sputtering installation has two longitudinally extended magnetrons disposed next to one another and each has a target on an upper side thereof. Increasing utilization of the targets in the sputtering installation is accomplished by homogenizing the discharge resistance of the magnetrons along the directrix such that a partial discharge resistance of a target point on the directrix has the same magnitude as the partial discharge resistance of a different target point on the directrix.

5 Claims, 2 Drawing Sheets

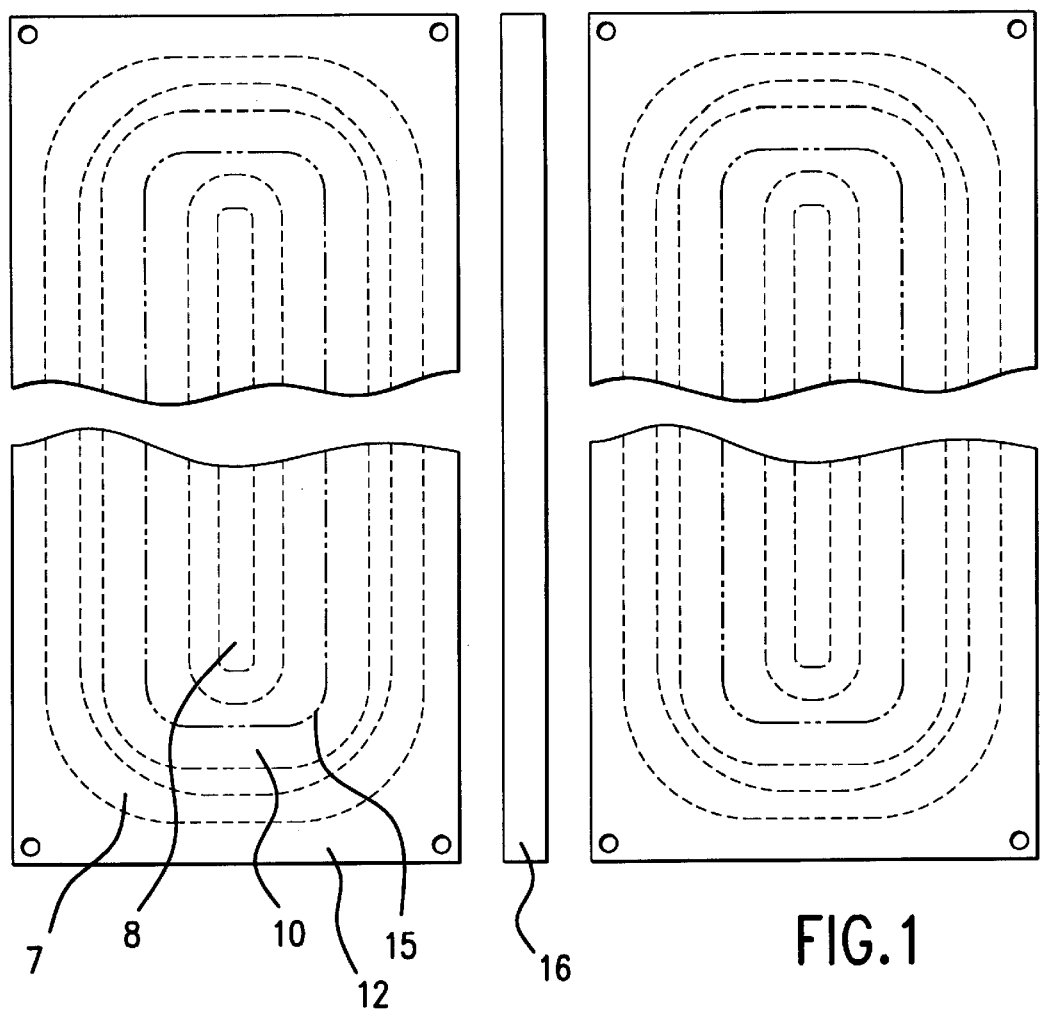
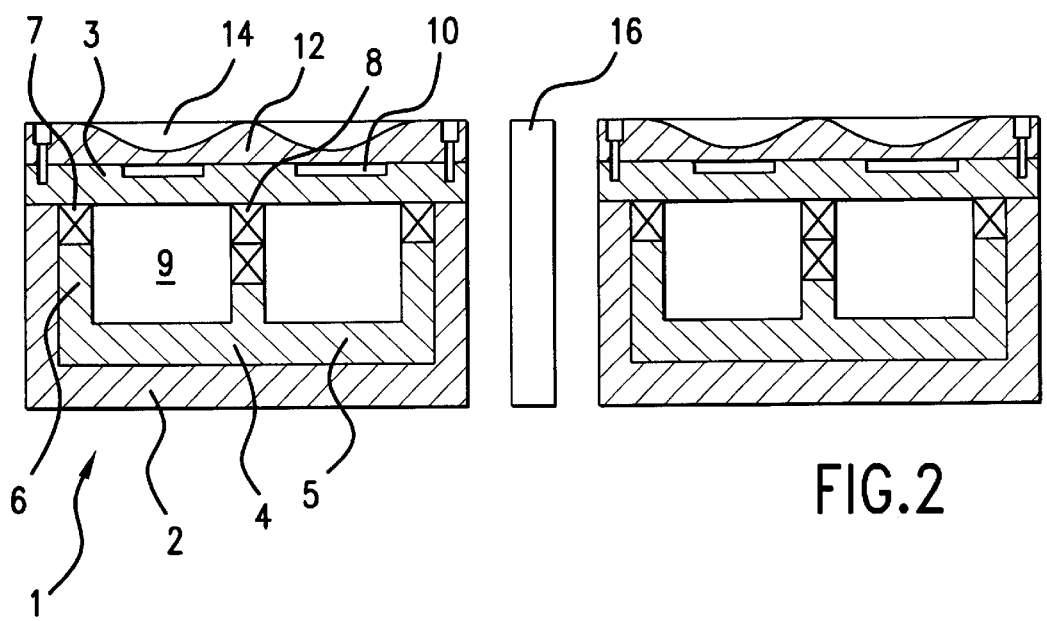
FIG.1
FIG.2

SPUTTERING INSTALLATION WITH TWO LONGITUDINALLY PLACED MAGNETRONS

BACKGROUND OF THE INVENTION

The invention relates to a sputtering installation with two longitudinally extending magnetrons, which are disposed next to one another and each have a target on an upper side thereof. Below the target, there is a U-shaped basic body, in which magnets, consisting of external and internal magnets, are enclosed. Between ground and one of the targets, there is a positive voltage, and between ground and another one of the targets, there is a negative voltage.

Sputtering installations with such longitudinally extending magnetrons lying next to one another, are known. In these installations, the target can be constructed in one piece or consist of several sections, preference being given to the latter variation.

During sputtering, material is ejected from the target and then deposited on the work, which is to be coated in the sputtering installation. During this sputtering process, material is not removed uniformly; instead, so-called erosion troughs are formed. The line linking the deepest places of this erosion trough is referred to as a directrix in that a partition of a weakly magnetic material is disposed between the two magnetrons and/or in that known shunts, that is insertions of weakly magnetic material, are introduced between the external and the internal magnets, the shunt on the side close to the respective other magnetron having a larger width than the shunt on the side averted from the respective other magnetron.

A target is to be regarded as consumed when the erosion trough, even at only one site of the target, is so deep, that the thickness of the material at this site is less than a threshold value. For this reason, efforts are made to ensure that the erosion trough is as wide as possible and to see to it that it has a uniform depth.

However, in the case of the sputtering installations mentioned, with two longitudinally extending magnetrons, it has turned out that the erosion trough at one end of the target is significantly deeper than in other regions. As a result of this deeper erosion, the targets are consumed significantly more rapidly.

Due to construction of such magnetrons with external and internal magnets, a longitudinally extending, but nevertheless ring-shaped magnetic field is developed.

The target voltages at the magnetron are poled differently. This means that, at a particular time, a positive voltage is applied between one target and ground and a negative voltage between the other target and ground. The target voltages and the ring-shaped magnetic fields bring about ring-shaped flows of electrons in the target. At a subsequent time, the polarity of the two voltages is changed. The directions of the electron flows within the target are determined by the polarities of the magnet arrangements.

It has now turned out that the sites at which there is a greater deepening of the erosion trough are at those ends of the magnetron at which the electron streams are directed to the respective other of the two magnetrons.

SUMMARY OF THE INVENTION

It is therefore an object of the invention to increase utilization of targets in sputtering installations wherein magnetrons lie next to one another.

Pursuant to the invention, this objective is accomplished due to the fact that a discharge resistance of a magnetron along a directrix is homogenized in such a manner that a partial discharge resistance of a target point on the directrix has the same magnitude as the partial discharge resistance of a different target point on the directrix in that a partition of a soft magnetic material is disposed between the two magnetrons and/or in that known shunts, that is insertions of soft magnetic material, are introduced between the external and the internal magnets, the shunt on the side close to the respective other magnetron having a larger width than the shunt on the side averted from the respective other magnetron.

The discharge resistance of the magnetron as a whole is determined by by a ratio of the target voltage to the target stream. As a result of the two-dimensional distribution of the target, the discharge resistance also experiences a distribution on the whole target, so that the discharge resistance actually arises out of the sum of a plurality of partial discharge resistances.

It is observed that, by homogenizing the discharge resistances along the directrix, deepening of the erosion trough at ends of the magnetrons, where the electron streams are directed to the other magnetron, are reduced appreciably.

In a particular development of the invention, provisions are made that a partition of a soft magnetic material is disposed between the two magnetrons. By means of such an arrangement of a partition, it is achieved that the magnetic fields of mutually adjacent magnetrons can affect one another appreciably less. With that, it is achieved that the magnetic field within a magnetron is almost the same on both sides. With such a regulation of the magnetic field, a homogenization of the discharge resistance is attained in a special manner.

In a further advantageous development of the invention, provisions are made that shunts, which are known and are inserts of a soft magnetic material, are introduced between external and internal magnets. The shunt on a side close to the other magnetron is wider than the shunt on side distal the other magnetron. With such an arrangement it has been observed that the magnetic field can be made to be almost the same on both sides of a magnetron. With that, a significant reduction in the mutual effect of the two magnetrons on one another is attained and a homogenization of the discharge resistance is also achieved.

It is particularly advantageous to provide a partition as well as shunts of different widths. Consequently, a particularly appropriate embodiment of the invention includes two adjacent magnetrons having soft magnetic shunts of different widths with wider width ones of the shunts being disposed on the side of the magnetrons adjacent the other magnetron and a partition member, formed of soft magnetic material, disposed between the two adjacent magnetrons.

BRIEF DESCRIPTION OF THE DRAWINGS

In the following, the present invention is to be described in greater detail by means of an example. In the associated drawings, FIG. 1 shows a plan view of an embodiment of a sputtering installation of the present invention, FIG. 2 shows a cross section through the embodiment of FIG. 1.

DETAILED DESCRIPTION

Figure 3:
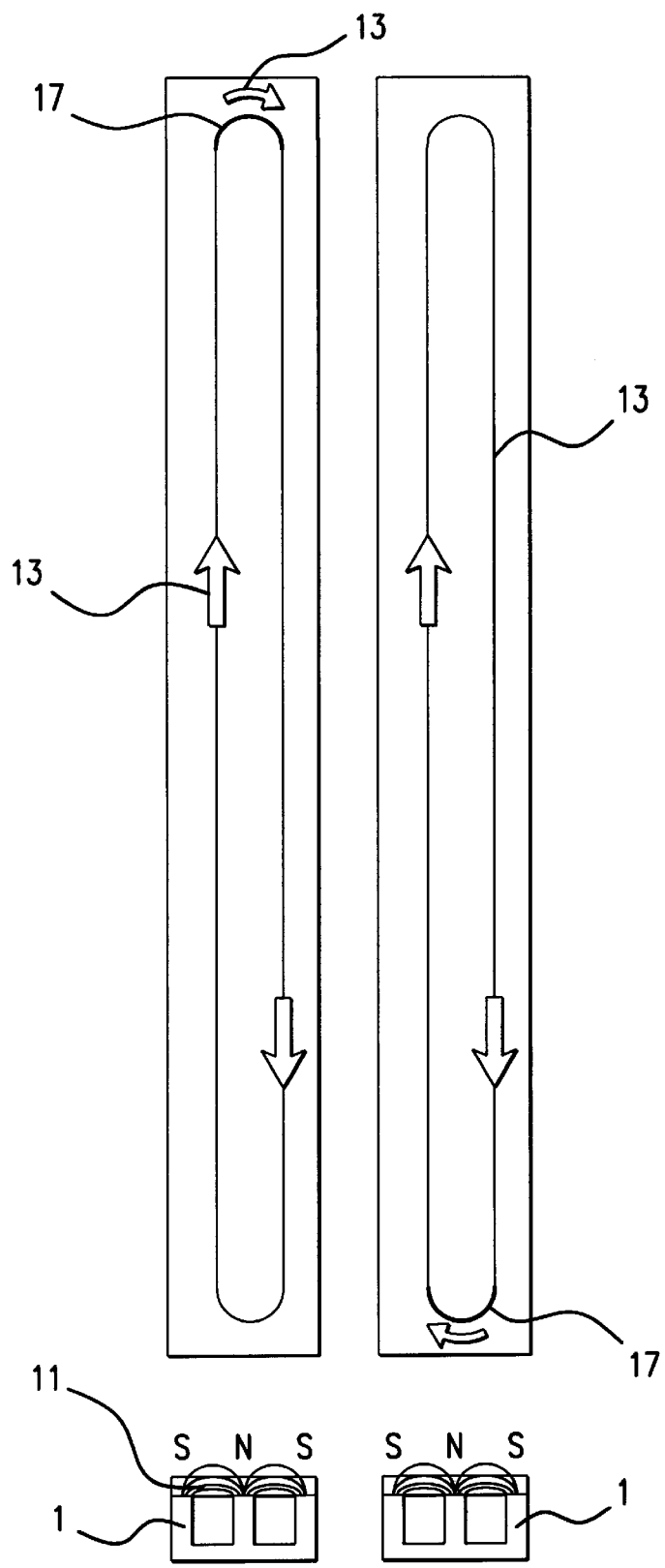
FIG. 3 shows a diagrammatic representation of a course of magnetic field lines and of electron flow.

Referring to FIGS. 1–3, an embodiment of a sputtering installation of the present invention includes two longitudinally extended magnetrons 1, which are disposed next to one another. Each of the magnetrons 1 has a U-shaped basic body 2, which is closed off at its upper side by a cooling plate 3. The basic body 2 encloses magnetic core elements 4. The magnetic core elements 4 have a horizontally lying basic element 5 and supporting elements 6 resting on the basic element 5. External magnets 7 and internal magnets 8 are disposed on an upper side of the supporting elements 6. A cavity 9, which accommodates coolant for dissipating heat from the cooling plate 3, is formed by the basic element 5, the supporting element 6 and the cooling plate 3.

Shunts 10 are disposed within the cooling plate 3. The shunts 10 are soft magnetic inserts and lie within a region of a magnetic field 11 between the external and internal magnets 7 and 8. The magnetic field 11 also penetrates through a target 12 lying on and fastened to the cooling plate 3.

A target voltage is applied between the target 12 and an electric ground, the details of which are not shown. As a result of the magnetic field 11, there is electron flow 13 within the target 12. The direction of the electron flow 13 is determined by the polarity of the magnets 7 and 8.

During a sputtering process, erosion troughs 14 are formed within the target 12. A line connecting deepest points of the erosion troughs 14 represents a directrix 15.

Due to the fact that the shunt 10 on the side of a magnetron 1 which lies opposite to the respectively other magnetron 1 is wider than the shunt on the respectively averted side of the magnetron, and that a partition 16 of soft magnetic material is introduced between the two magnetrons 1, the mutual influence of the magnetic fields 11 is minimized to such an extent that discharge resistance along the directrix 15 is homogenized. The discharge resistance $R_E$ arises out of $$R_E = \sum_{i1}^{in} R_{E_i}$$

wherein $R_{E_i}$ represents a partial charge resistance at a point on the target. $R_E$ itself is calculated to be $$R_E = \frac{U_T}{I_E}$$

wherein $U_T$ is the target voltage and $I_E$ is the discharge current. From these relationships, it turns out that a homogenization of the discharge resistance $R_E$ along the directrix 15 means that the partial discharge resistances $R_{E_i}$ at each point of the target on the directrix have the approximately same value of a different point of the target 12 on the directrix 15.

By homogenizing the discharge resistance $R_E$, it is achieved that the erosion trough 14 in endangered target regions 17, identified in FIG. 3, in which namely the electron flow 13 of the magnetron 1 is directed onto the respectively adjacent magnetron 1, is not formed deeper than it is in the remaining regions of the target 12. By means of a largely uniform depth of the erosion trough 14, it thus becomes possible for target utilization to be increased relative to that of the state of the art, for which a deepening of the erosion trough 14 would occur in the endangered target region 17.

What is claimed is:

1. A sputtering apparatus comprising:

longitudinally extending first and second magnetrons disposed adjacent one another;

said first and second maagnetrons each including:
 a U-shaped basic body;
 a magnetic assembly having external and internal magnets enclosed within the U-shaped basic body;

said external and internal magnets defining first and second longitudinal sides; and a target disposed on top of said U-shaped body wherein a directrix is formed having point discharge resistances which combine in determining a discharge resistance for the respective magnetron;

means for alternately respectively applying negative and positive voltages, with respect to ground, to said targets of said first and second magnetrons such that said targets are charged to opposing polarities with respect to ground;

a partition member, formed of a soft magnetic material, disposed longitudinally between the first and second magnetrons;

said first and second magnetrons being disposed with said first longitudinal sides disposed adjacent one another;

said first and second magnetrons having first and second shunts, formed of soft magnetic material, disposed respectively between said external magnets and said internal magnets in said first and second longitudinal sides, and said first shunts having a width greater than said second shunts; and wherein said partition member and said first and second shunts substantially homogenize the discharge resistances of the first and second magnetrons along the directrixes thereof such that partial discharge resistances of target points on the directrixes have substantially the same magnitude as a second partial discharge resistance of different target points on the directrixes.

2. The apparatus of claim 1 wherein said partition member is interposed between the targets of the first and second magnetrons.

3. The apparatus of claim 1 wherein said partition member is interposed between the targets of the first and second magnetrons and extends substantially along lengths of said first and second magnetrons.

4. The apparatus of claim 1 wherein said partition member has a height and length substantially corresponding to the length of said first and second magnetrons and is interposed between the targets of the first and second magnetrons.

5. A sputtering apparatus comprising:

longitudinally extending first and second magnetrons disposed adjacent one another;

said first and second magnetrons each including:
 a U-shaped basic body;

a magnetic assembly having external and internal magnets enclosed within the U-shaped basic body;

said external and internal magnets defining first and second longitudinal sides; and a target disposed on top of said U-shaped body wherein a directrix is formed having point discharge resistances which combine in determining a discharge resistance for the respective magnetron;

means for alternately respectively applying negative and positive voltages, with respect to ground, to said targets of said first and second magnetrons such that said targets are charged to opposing polarities with respect to ground;

said first and second magnetrons being disposed with said first longitudinal sides disposed adjacent one another;

said first and second magnetrons having first and second shunts, formed of soft magnetic material, disposed respectively between said external magnets and said internal magnets in said first and second longitudinal sides, and said first shunts having a width greater than said second shunts; and wherein said first and second shunts substantially homogenize the discharge resistances of the first and second magnetrons along the directrixes thereof such that partial discharge resistances of target points on the directrixes have substantially the same magnitude as a second partial discharge resistance of different target points on the directrixes.

* * * * *